United States Patent
Miyamoto

(10) Patent No.: US 7,768,845 B2
(45) Date of Patent: Aug. 3, 2010

(54) MEMORY HAVING CIRCUITRY TO DIRECTLY CHANGE VOLTAGES APPLIED TO BIT LINES AND WORD LINES IN RESPONSE TO TRANSITIONS BETWEEN A READ OPERATION, FIRST REWRITE OPERATION, AND SECOND REWRITE OPERATION

(76) Inventor: Hideaki Miyamoto, 310-20, Arakawa-cho, Ogaki-shi, Gifu 503-0993 (JP)

( * ) Notice: Subject to any disclaimer, the term of this patent is extended or adjusted under 35 U.S.C. 154(b) by 612 days.

(21) Appl. No.: 11/727,466

(22) Filed: Mar. 27, 2007

(65) Prior Publication Data

US 2007/0223268 A1 Sep. 27, 2007

(30) Foreign Application Priority Data

Mar. 27, 2006 (JP) .............................. 2006-085628

(51) Int. Cl.
*G11C 7/00* (2006.01)
(52) U.S. Cl. ..................... 365/191; 365/145; 365/222
(58) Field of Classification Search .................. 365/145, 365/191, 222
See application file for complete search history.

(56) References Cited

U.S. PATENT DOCUMENTS

| | | | | |
|---|---|---|---|---|
| 6,795,351 | B2 * | 9/2004 | Sakai | 365/189.09 |
| 7,016,217 | B2 * | 3/2006 | Sakai et al. | 365/145 |
| 7,110,279 | B2 * | 9/2006 | Miyamoto et al. | 365/145 |
| 7,251,153 | B2 * | 7/2007 | Sakai | 365/145 |
| 7,411,841 | B2 * | 8/2008 | Sakai | 365/189.09 |
| 7,420,833 | B2 * | 9/2008 | Dan et al. | 365/145 |
| 7,460,425 | B2 * | 12/2008 | Miyamoto | 365/222 |
| 7,564,730 | B2 * | 7/2009 | Miyamoto | 365/222 |
| 7,652,908 | B2 * | 1/2010 | Miyamoto et al. | 365/145 |
| 2004/0174729 | A1 * | 9/2004 | Sakai et al. | 365/145 |
| 2006/0067139 | A1 * | 3/2006 | Sakai et al. | 365/189.09 |

FOREIGN PATENT DOCUMENTS

JP 2005-38573 A 2/2005
KR 10-2005-0052662 6/2005

OTHER PUBLICATIONS

Korean Office Action, with English translation, issued in Korean Patent Application No. KR 10-2007-0029951, mailed Mar. 24, 2008.
Office Action, issued in Chinese Application No. 200710088480.1, mailed Dec. 12, 2008.

* cited by examiner

*Primary Examiner*—Hoai V Ho
*Assistant Examiner*—Kretelia Graham
(74) *Attorney, Agent, or Firm*—Schwabe, Williamson & Wyatt, P.C.

(57) ABSTRACT

A memory capable of operating at a high speed is obtained. This memory includes memory cells arranged on the intersectional positions between bit lines and word lines respectively. A read operation and a first and second rewrite operations performed when reading data of the memory cells are started by changing voltages applied to the bit lines and the word lines to applied voltages responsive to each operation, and when each operation performed when reading data of the memory cells is transferred, the voltages applied to the bit lines and the word lines are directly changed from the applied voltages responsive to the operation before transition to the applied voltages responsive to the operation after transition.

32 Claims, 8 Drawing Sheets

FIG.9    (PRIOR ART)
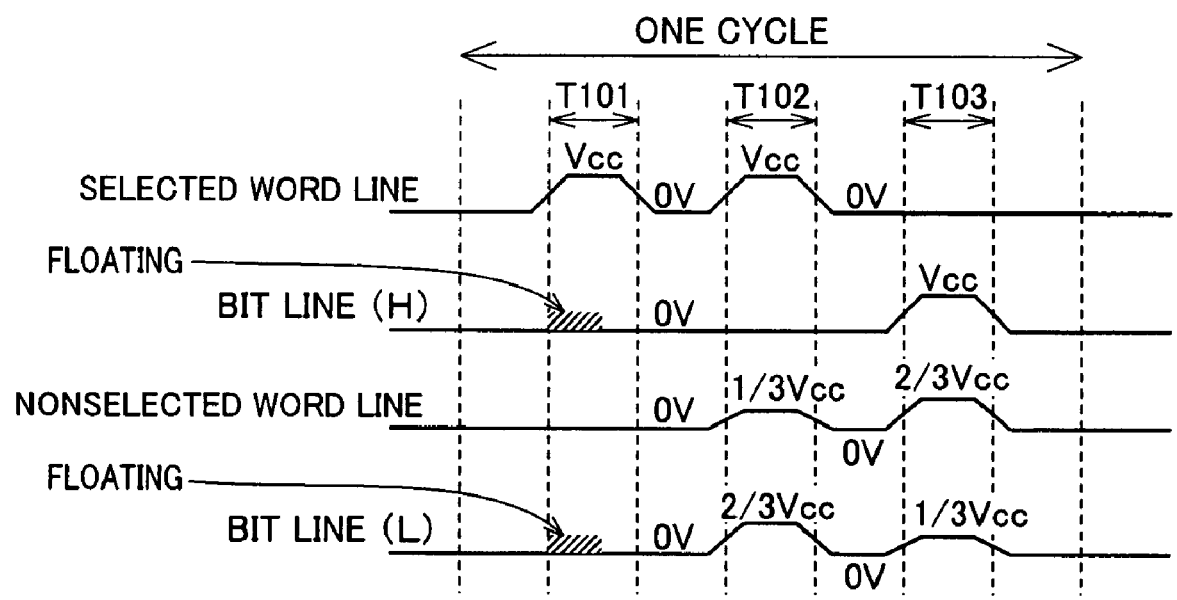

MEMORY HAVING CIRCUITRY TO DIRECTLY CHANGE VOLTAGES APPLIED TO BIT LINES AND WORD LINES IN RESPONSE TO TRANSITIONS BETWEEN A READ OPERATION, FIRST REWRITE OPERATION, AND SECOND REWRITE OPERATION

BACKGROUND OF THE INVENTION

1. Field of the Invention

The present invention relates to a memory, and more particularly, it relates to a memory comprising a bit line and a word line.

2. Description of the Background Art

A memory (ferroelectric memory) provided with memory cells including ferroelectric capacitors on intersectional positions between bit lines and word lines arranged to intersect with each other is know in general. This memory performs a rewrite operation after performing a read operation, when reading data of the memory cells.

FIG. 9 is a voltage waveform diagram for illustrating operations of a ferroelectric memory of related art. Bit lines (H) in FIG. 9 is bit lines to which a reading voltage corresponding to data "H" is outputted, while bit lines (L) in FIG. 9 is bit lines to which a reading voltage corresponding to data "L" is outputted. The ferroelectric memory of related art performs read and rewrite operations in periods T101 to T103 (one cycle), with reference to FIG. 9.

More specifically, the period T101 is a period for a read operation. In this period T101, the potential of a selected word line is set to Vcc, while the potential of nonselected word lines is set to 0 V. The ferroelectric memory brings the bit lines (H) and the bit lines (L) into floating states. Thus, data "H" is read to the bit lines (H), while data "L" is read to the bit line L. Data "L" is written in both memory cells corresponding to the bit lines (H) and the bit lines (L) by the read operation. The period T102 is a period for a first rewrite operation. In this period T102, the potential of the selected word line is set to Vcc, while the potential of the nonselected word lines is set to ⅓ Vcc. The potential of the bit lines (H) is set to 0V, while the potential of the bit lines (L) is set to ⅔ Vcc. Thus, data "L" is rewritten in the memory cells corresponding to the bit lines (H), while no data is written in the memory cells corresponding to the bit lines (L). The period T103 is a period for a second rewrite operation. In this period T103, the potential of the selected word line is set to 0 V, while the potential of the nonselected word lines is set to ⅔ Vcc. The potential of the bit lines (H) is set to VCC, while the potential of the bit lines (L) is set to ⅓ Vcc. Thus, data "H" is written in the memory cells corresponding to the bit lines (H), while no data is written in the memory cells corresponding to the bit lines (L).

In the ferroelectric memory of related art, the respective potentials of the bit lines and the word lines are controlled in the aforementioned manner, whereby data is read in the period T101 while data is rewritten in the periods T102 and T103.

In the ferroelectric memory of related art, however, a period during which a voltage (0V) other than the voltages responsive to the read operation and the first rewrite operation are applied to the selected word line and the bit lines (L) is provided between the period T101 (read operation) and the period T102 (first rewrite operation) as shown in FIG. 9. A period during which a voltage (0V) other than the voltages responsive to the first rewrite operation and the second rewrite operation are applied to the nonselected word lines and the bit lines (L) is provided between the period T102 (first rewrite operation) and the period T103 (second rewrite operation). Thus, a period of time necessary for one cycle including a read operation, a first rewrite operation and a second rewrite operation is disadvantageously increased. Consequently, it is disadvantageously difficult to operate the ferroelectric memory at a high speed.

SUMMARY OF THE INVENTION

The present invention has been proposed in order to solve the aforementioned problem, and an object of the present invention is to provide a memory capable of operating at a high speed.

In order to attain the aforementioned object, a memory according to an aspect of the present invention comprises bit lines and word lines arranged to intersect with each other, and memory cells arranged on the intersectional positions between the bit lines and the word lines respectively. A read operation and a rewrite operation consisting of a plurality of operations are performed when data of the memory cells is read, the read operation and the rewrite operation consisting of the plurality of operations performed when reading data of the memory cells are started by changing voltages applied to the bit lines and the word lines to applied voltages responsive to each operation, and when) each operation performed when reading data of the memory cells is transferred, the voltages applied to the bit lines and the word lines are directly changed from the applied voltages responsive to the operation before transition to the applied voltages responsive to the operation after transition.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a voltage waveform diagram for illustrating operations of a ferroelectric memory of related art.

DESCRIPTION OF THE PREFERRED EMBODIMENTS

Embodiments of the present invention will be hereinafter described with reference to the drawings.

First Embodiment

A structure of a ferroelectric memory according to a first embodiment will be now described with reference to FIGS. 1 and 2.

Figure 1:
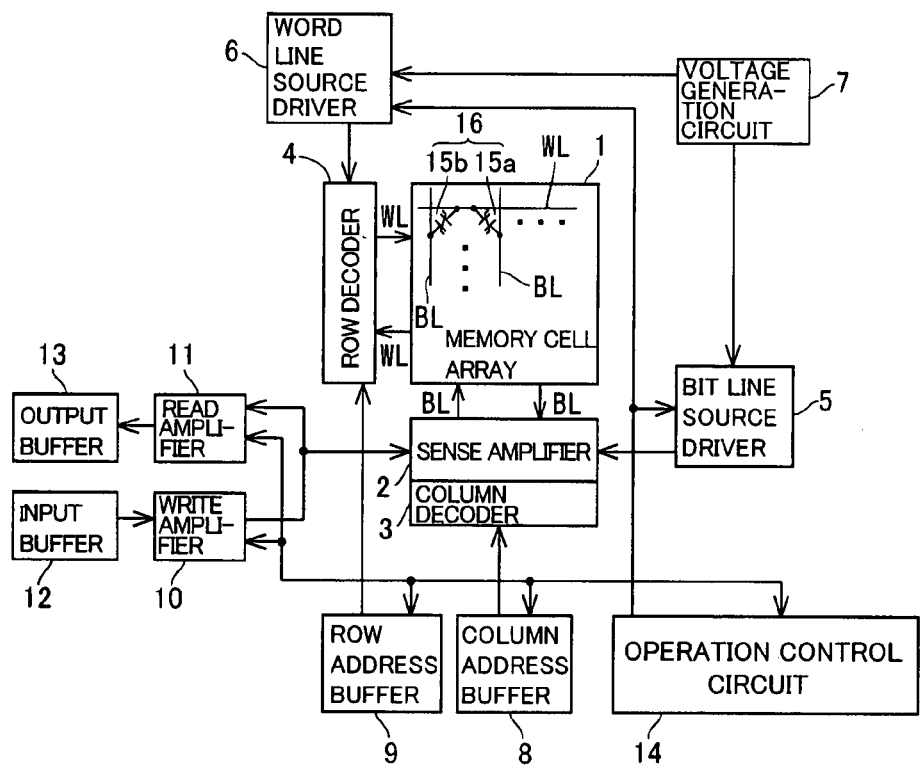
FIG. 1 is a block diagram for illustrating an overall structure of a ferroelectric memory according to a first embodiment of the present invention.

The ferroelectric memory according to the first embodiment comprises a memory cell array 1, a sense amplifiers 2, a column decoder 3, a row decoder 4, a bit line source driver 5, a word line source driver 6, a voltage generation circuit 7, a column address buffer 8, a row address buffer 9, a write amplifier 10, a read amplifier 11, an input buffer 12, an output buffer 13 and an operation control circuit 14, as shown in FIG. 1. The sense amplifiers 2 are examples of the "holding portion" in the present invention.

In the memory cell array 1, a plurality of bit lines BL and a plurality of word lines WL are arranged to intersect with each other. The bit lines BL are connected to the column decoder 3 through the sense amplifiers 2, while the word lines WL are connected to the row decoder 4. A ferroelectric capacitor 15a or 15b is provided in each of intersectional positions between the plurality of bit lines BL and the plurality of word lines WL. The ferroelectric capacitors 15a (15b) include the corresponding bit lines BL, the corresponding word lines WL and ferroelectric films (not shown) arranged between the bit lines BL and the word lines WL. According to the first embodiment, two ferroelectric capacitors 15a and 15b constitute one memory cell 16.

In the memory cells 16 holding data "H", the first ferroelectric capacitors 15a hold data "H", while the second ferroelectric capacitors 15b hold data "L". On the other hand, in the memory cells 16 holding data "L", the first ferroelectric capacitors 15a hold data "L", while the second ferroelectric capacitors 15b hold data "H".

The bit line source driver 5 and the word line source driver 6 are connected to the sense amplifiers 2 and the row decoder 4, respectively. A signal having a prescribed potential (Vcc, ⅓ Vcc or ⅔ Vcc) generated in the voltage generation circuit 7 is supplied to the bit line source driver 5 and the word line source driver 6. The column address buffer 8 and the row address buffer 9 are connected to the column decoder 3 and the row decoder 4, respectively. The write amplifier 10 and the read amplifier 11 are connected to the sense amplifiers 2, while the input buffer 12 and the output buffer 13 are connected to the write amplifier 10 and the read amplifier 11 respectively. The operation control circuit 14 is connected to the column decoder 3, the bit line source driver 5, the word line source driver 6, the column address buffer 8, the row address buffer 9, the write amplifier 10 and the read amplifier 11.

Figure 2:
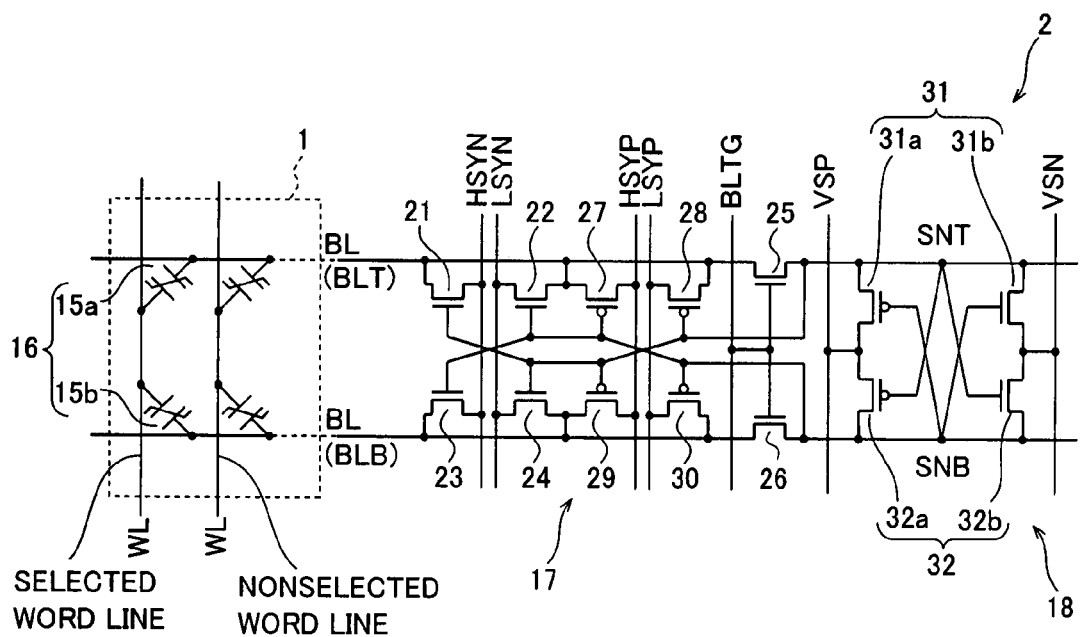
FIG. 2 is a circuit diagram showing an internal structure of a sense amplifier of the ferroelectric memory according to the first embodiment shown in FIG. 1.

As shown in FIG. 2, each sense amplifier 2 includes the bit line control portion 17 for controlling the potentials of the bit lines BL and the amplification portion 18 for holding and amplifying a reading voltage outputted from each memory cell 16 to the bit lines BL. In FIG. 2, the bit lines BL connected to the ferroelectric capacitors 15a are referred to as bit lines BLT, while the bit lines BL connected to the ferroelectric capacitors 15b are referred to as bit lines BLB.

Each bit line control portion 17 includes six n-channel transistors 21 to 26 and four p-channel transistors 27 to 30. Sources of the n-channel transistors 21 and 22 are connected to the bit line BLT, while sources of the n-channel transistors 23 and 24 are connected to the bit line BLB. Drains of the n-channel transistors 21 and 23 are supplied with a bit line source signal HSYN from the bit line source driver 5 (see FIG. 1), while drains of the n-channel transistors 22 and 24 are supplied with a bit line source signal LSYN from the bit line source driver 5. Gates of the n-channel transistor 21 and 24 are connected to a node SNT of the amplification portion 18, while gates of the n-channel transistors 22 and 23 are connected to a node SNB of the amplification portion 18.

Drains of the p-channel transistors 27 and 28 are connected to the bit line BLT, while drains of the p-channel transistors 29 and 30 are connected to the bit line BLB. Sources of the p-channel transistors 27 and 29 are supplied with a bit line source signal HSYP from the bit line source driver 5 (see FIG. 1), while sources of the p-channel transistors 28 and 30 are supplied with a bit line source signal LSYP from the bit line source driver 5. Gates of the p-channel transistors 27 and 30 are connected to the node SNB of the amplification portion 18, while gates of the p-channel transistors 28 and 29 are connected to the node SNT of the amplification portion 18.

A drain of the n-channel transistor 25 is connected to the bit line BLT, while a source thereof is connected to the node SNT of the amplification portion 18. A drain of the n-channel transistor 26 is connected to the bit line BLB, while a source thereof is connected to the node SNB of the amplification portion 18. Gates of the n-channel transistors 25 and 26 are supplied with a latch signal BLTG from the bit line source driver 5 (see FIG. 1).

Each amplification portion 18 includes two inverter circuits 31 and 32. The inverter circuit 31 is constituted by a p-channel transistor 31a and an n-channel transistor 31b, while the inverter circuit 32 is constituted by a p-channel channel transistor 32a and an n-channel transistor 32b. Input terminals of the inverter circuit 32 (gates of the p-channel transistor 32a and the n-channel transistor 32b) are connected to an output terminal (node SNT) of the inverter circuit 31. Input terminals (gates of the p-channel transistor 31a and the n-channel transistor 31b) of the inverter circuit 31 are connected to an output terminal (node SNB) of the inverter circuit 32. Sources of the p-channel transistors 31a and 32a are supplied with a signal VSP from the bit line source driver 5 (see FIG. 1), while sources of the n-channel transistors 31b and the 32b are supplied with a signal VSN from the bit line source driver 5. The signal VSP (signal VSN) reaches the level Vcc (Vss) when the potential of a sense amplifier activation signal (not shown) reaches the level Vcc, while the signal VSP (signal VSN) reaches the level Vss (Vcc) when the potential of the sense amplifier activation signal reaches the level Vss.

With reference to FIGS. 1 to 4, read and rewrite operations of the ferroelectric memory according to the first embodiment will be now described. To simplify the description, one sense amplifier 2 and the memory cells connected thereto will be hereinafter described. In the following description of the operations, it is assumed that the memory cell 16 which is selected holds data "H". In other words, it is assumed that the ferroelectric capacitors 15a and 15b constituting the memory cell 16 which is selected hold data "H" and data "L" respectively. In the following description of the operations, the memory cell 16 which is selected is referred to as selected memory cell 16, while the memory cells 16 which are nonselected are referred to as nonselected memory cells 16. The word line WL which is selected is referred to as a selected word line WL, while the word lines WL which are nonselected are referred to as nonselected word lines WL.

Figure 3:
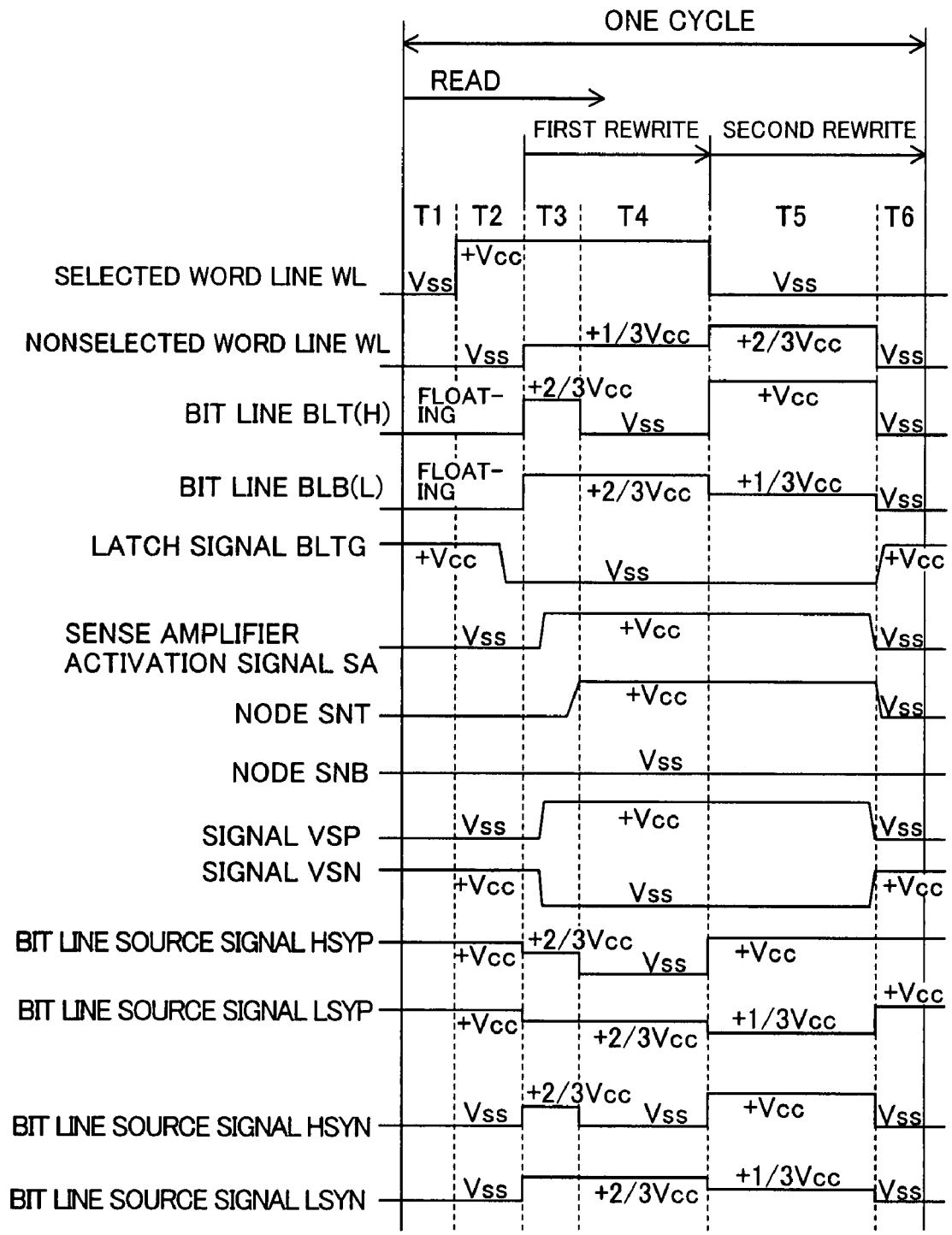
FIGS. 3 and 4 are voltage waveform diagrams for illustrating operations of the ferroelectric memory according to the first embodiment of the present invention.

The ferroelectric memory according to the first embodiment performs the read and rewrite operations in the periods T1 to T6 (one cycle), as shown in FIG. 3. According to the first embodiment, the ferroelectric memory performs the read operation from the period T1 to the middle of the period T4. The read operation of the first embodiment includes a holding operation holding a reading voltage outputted to the bit lines BL and an amplification operation amplifying a reading voltage which is held.

The ferroelectric memory performs a first rewrite operation in the periods T3 and T4, while performing a second rewrite operation in the periods T5 and T6. In other words, according to the first embodiment, the first rewrite operation is started in the period T3 during which the read operation is performed. The first rewrite operation (periods T3 and T4) of the first embodiment is not an operation for rewriting data but an operation for suppressing a disturbance in the nonselected memory cells 16. In other words, according to the first embodiment, the rewrite of data is performed by the second rewrite operation (periods T5 and T6). Operations in the periods T1 to T6 will be hereinafter more specifically described.

(Period T1)

As shown in FIG. 3, the voltages applied to the selected word line WL and the nonselected word lines WL are held at the level VSS in the period T1 (initial state). The bit lines BLT and BLB are held in floating states. The potential of the latch signal BLTG is held at the level Vcc. The potential of the sense amplifier activation signal SA is held at the level Vss, while the potentials of the signals VSP and VSN are held at the levels Vss and Vcc respectively. The potentials of the bit line source signals HSYP and LSYP are held at the level Vcc, while the potentials of the bit line source signals HSYN and LSYN are held at the level Vss. In the period T1 (initial state), the potential of the latch signal BLTG is the level Vcc, whereby the n-channel transistor 25 of the bit line control portion 17 linking the bit line BLT and the amplification portion 18 (node SNT) shown in FIG. 2 is in an ON-state, while the n-channel transistor 26 of the bit line control portion 17 linking the bit line BLB and the amplification portion 18 (node SNB) is in an ON-state.

(Period T2)

In this period T2, the voltage applied to the selected word line WL is changed from the level Vss to the level Vcc as shown in FIG. 3, thereby generating reading voltages in the bit lines BLT and BLB. The reading voltages generated in the bit lines BLT and BLB is sufficiently smaller than ⅔ Vcc. At this time, as shown in FIG. 2, the reading voltage generated in the bit line BLT is transmitted to the node SNT of the amplification portion 18 through the n-channel transistor 25 in an ON-state of the bit line control portion 17. The reading voltage generated in the bit line BLB is transmitted to the node SNB of the amplification portion 18 through the n-channel transistor 26 in an ON-state of the bit line control portion 17. Thereafter, the latch signal BLTG is stepped down from the level Vcc to the level Vss (see FIG. 3), thereby turning off the n-channel transistors 25 and 26. Thus, the bit lines BLT and BLB and the amplification portion 18 are electrically isolated from each other. Consequently, the node SNT of the amplification portion 18 holds the reading voltage generated in the bit line BLT, while the node SNB of the amplification portion 18 holds the reading voltage generated in the bit line BLB.

The reading voltage generated in the bit line BLT is supplied from the amplification portion 18 (node SNT) to the gates of the n-channel transistors 21 and 24 and the p-channel transistors 28 and 29 of the bit line control portion 17. The reading voltage generated in the bit line BLB is supplied from the amplification portion 18 (node SNB) to the gates of the n-channel transistors 22 and 23 and the p-channel transistors 27 and 32 of the bit line control portion 17.

The ferroelectric memory performs the aforementioned read operation, thereby destroying data "H" held in the ferroelectric capacitor 15a included in the selected memory cell 16. More specifically, data "L" is written in the ferroelectric capacitor 15a included in the selected memory cell 16. On the other hand, data "L" is written in the ferroelectric capacitor 15b included in the selected memory cell 16.

(Period T3)

In this period T3, the voltage applied to the selected word line WL is directly changed from the applied voltage (Vcc) responsive to the read operation to the applied voltage (Vcc) responsive to the first rewrite operation as shown in FIG. 3. The voltage applied to the nonselected word lines WL is directly changed from the applied voltage (Vss) responsive to the read operation to the applied voltage (⅓ Vcc) responsive to the first rewrite operation. The potentials of the bit line source signals HSYP and LSYP are stepped down from the level Vcc to the level ⅔ Vcc, while the potentials of the bit line source signals HSYN and LSYN from are stepped up the level Vss to the level ⅔ Vcc.

Therefore, as shown in FIG. 2, in the bit line control portion 17, the p-channel transistors 27 to 30 having sources supplied with either the bit line source signal HSYP or the bit line source signal LSYP of the level ⅔ Vcc have sufficiently smaller reading voltages than the voltage ⅔ Vcc supplied to the gates, whereby the absolute value of the potential difference between the gate and the source is larger than the absolute value of a threshold voltage. Thus, the p-channel transistors 27 to 30 are turned on. Consequently, the bit line source signals HSYP and LSYP of the level ⅔ Vcc are supplied to the bit line BLT through the p-channel transistors 27 and 28 in ON-states. The bit line source signals HSYP and LSYP of the level ⅔ Vcc are supplied to the bit line BLB through the p-channel transistors 29 and 30 in ON-states. At this time, the n-channel transistors 21 to 24 of the bit line control portion 17 are in OFF-states. Consequently, the voltages applied to the bit lines BLT and BLB is directly changed from the applied voltages (reading voltage) responsive to the read operation to the applied voltages (⅔ Vcc) responsive to the first rewrite operation, as shown in FIG. 3. Thus, no data is written in the ferroelectric capacitors 15a and 15b included in the selected memory cell 16 until data determination is terminated based on the amplified reading voltages.

In the period T3, the potential of the sense amplifier activation signal SA is stepped up from the level Vss to the level Vcc. Thus, the potential of the signal VSP (see FIG. 3) supplied to the sources of the p-channel transistors 31a and 32a of the amplification portion 18 is stepped up from the level Vss to the level Vcc, as shown in FIG. 2. The potential of the signal VSN (see FIG. 3) supplied to the sources of the n-channel transistors 31b and 32b of the amplification portion 18 is stepped down from the level Vcc to the level Vss. At this time, in the amplification portion 18, the absolute value of the potential difference between the gate and the source of the p-channel transistor 31a is larger than the absolute value of a threshold voltage, whereby the p-channel transistor 31a is turned on. The absolute value of the potential difference between the gate and the source of the n-channel transistor 32b is larger than the absolute value of a threshold voltage, whereby the n-channel. transistor 32b is turned on. In other words, the amplification portion 18 is activated.

Thus, the signal VSP of the level Vcc is supplied to the node SNT of the amplification portion 18 through the p-channel transistor 31a in an ON-state, while the signal VSN of the level Vss is supplied to the node SNB of the amplification portion 18 through the n-channel transistor 32b in an ON-state. Consequently, the reading voltage of the bit line BLT, held in the node SNT of the amplification portion 18, is stepped up to the level Vcc, while the reading voltage of the bit line BLB, held in the node SNB of the amplification portion 18, is stepped down to the level Vss. In other words, in the amplification portion 18, the difference between the reading voltage of the bit line BLT and the reading voltage of the bit line BLB is amplified. This amplification operation in the amplification portion 18 starts from the period T3 and continues until the period T5 (see FIG. 3) terminates. Data determination is performed based on the amplified reading voltage and thereafter a signal corresponding to the reading voltage is outputted through the read amplifier 11 and the output buffer 13 shown in FIG. 1.

As shown in FIG. 2, the of the amplified reading voltage Vcc of the bit line BLT is supplied from the amplification portion 18 (node SNT) to the gates of the n-channel transistors 21 and 24 and the p-channel transistors 28 and 29 of the bit line control portion 17. The amplified reading voltage Vss of the bit line BLB is supplied from the amplification portion 18 (node SNB) to the gates of the n-channel transistors 22 and 23 and the p-channel transistors 27 and 30 of the bit line control portion 17. Thus, the n-channel transistors 21 and 24 are turned on, while the n-channel transistors 22 and 23 are turned off. The p-channel transistors 27 and 30 are turned on, while the p-channel transistors 28 and 29 are turned off.

Figure 4:
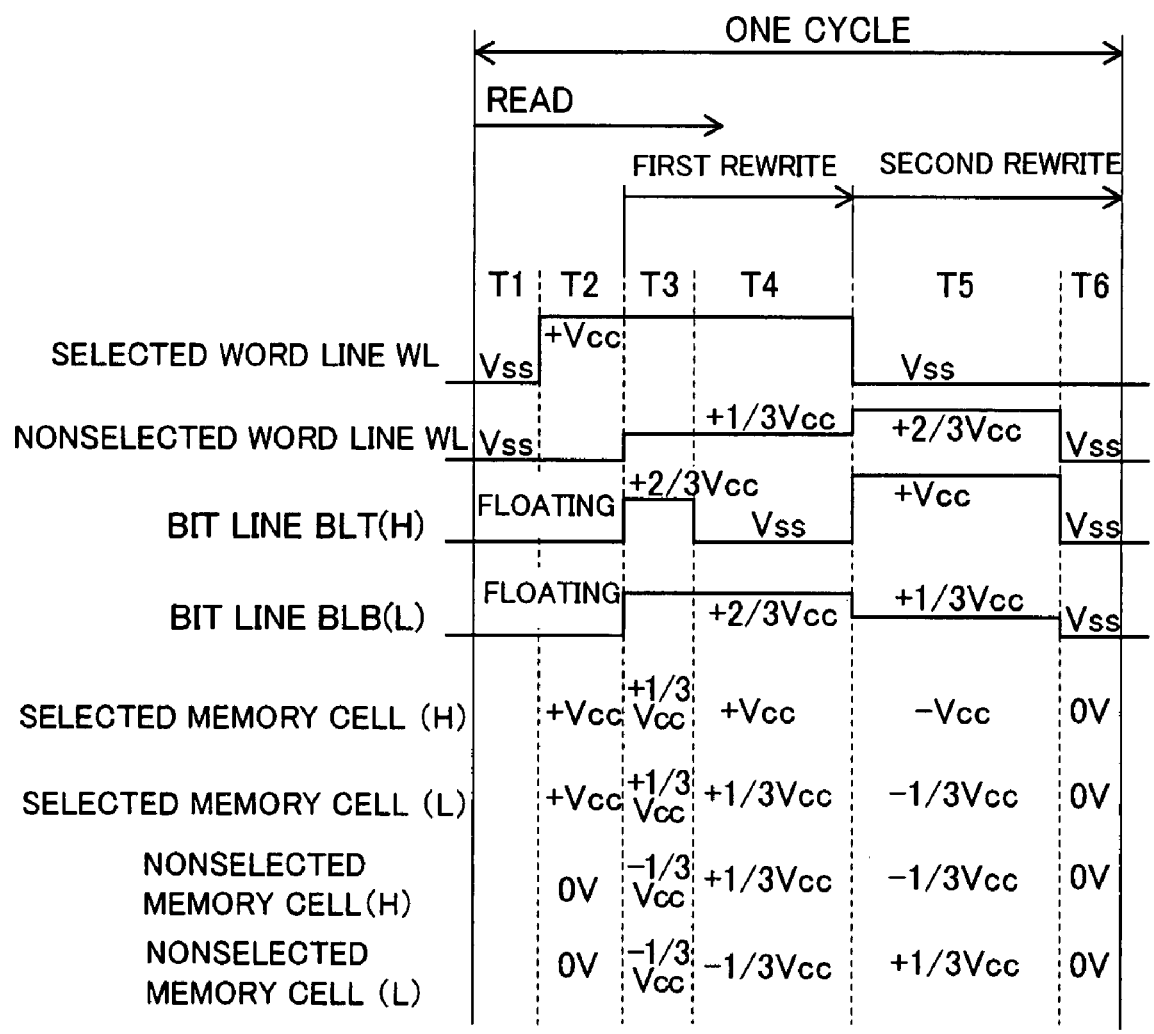

In the aforementioned period T3, the voltage +⅓ Vcc is applied to the ferroelectric capacitor 15a (see FIG. 2) included in the selected memory cell 16 connected to the bit line BLT as shown in FIG. 4. The voltage +⅓ Vcc is applied also to the ferroelectric capacitor 15b (see FIG. 2) included in the selected memory cell 16 connected to the bit line BLB. The voltage −⅓ Vcc is applied the to the ferroelectric capacitors 15a included in the nonselected memory cells 16 connected to the bit line BLT. The voltage −⅓ Vcc is applied also to the ferroelectric capacitors 15b included in the nonselected memory cells 16 connected to the bit line BLB.

(Period T4)

In this period T4, the potentials of the bit line source signals HSYP and HSYN are stepped down from the level ⅔ Vcc to the level Vss, while the potentials of the bit line source signals LSYP and LSYN are held at ⅔ Vcc, as shown in FIG. 3.

In this case, in the bit line control portion 17, the bit line source signal HSYN of the level Vss is supplied to the bit line BLT through the n-channel transistor 21 in an ON-state, while the bit line source signal LSYN of the level ⅔ Vcc is supplied to the bit line BLB through the n-channel transistor 24 in an ON-state, as shown in FIG. 2. The bit line source signal HSYP of the level Vss is also supplied to the bit line BLT through the p-channel transistor 27 in an ON-state, while the bit line source signal LSYP of the level ⅔ Vcc is also supplied to the bit line BLB through the p-channel transistor 30 in an ON-state. Consequently, as shown in FIG. 3, the voltage applied to the bit line BLT is changed from the level ⅔ Vcc to the level Vss, while the voltage applied to the bit line BLB is held at the level ⅔ Vcc.

In the aforementioned period T4, data "L" is rewritten in the ferroelectric capacitor 15a included in the selected memory cell 16. On the other hand, no data is written in the ferroelectric capacitor 15b included in the selected memory cell 16.

In the aforementioned period T4, the voltage +Vcc is applied to the ferroelectric capacitor 15a (see FIG. 2) included in the selected memory cell 16 connected to the bit line BLT as shown in FIG. 4. The voltage +⅓ Vcc is applied to the ferroelectric capacitor 15b (see FIG. 2) included in the selected memory cell 16 connected to the bit line BLB. The voltage +⅓ Vcc is applied to the ferroelectric capacitors 15a included in the nonselected memory cells 16 connected to the bit line BLT. The voltage −⅓ Vcc is applied to the ferroelectric capacitors 15b included in the nonselected memory cells 16 connected to the bit line BLB.

(Period T5)

In this period T5, the voltage applied to the selected word line WL is directly changed from the applied voltage (Vcc) responsive to the first rewrite operation to the applied voltage (Vss) responsive to the second rewrite operation, as shown in FIG. 3. The voltage applied to the nonselected word lines WL is directly changed from the applied voltage (⅓ Vcc) responsive to the first rewrite operation to the applied voltage (⅔ Vcc) responsive to the second rewrite operation. The potentials of the bit line source signals HSYP and HSYN are stepped up from the level Vss to the level Vcc, while the potentials of the bit line source signals LSYP and LSYN are stepped down from the level ⅔ Vcc to the level ⅓ Vcc.

In this case, in the bit line control portion 17, the bit line source signal HSYN of the level Vcc is supplied to the bit line BLT through the n-channel transistor 21 in an ON-state, while the bit line source signal HSYP of the level Vcc is supplied to the bit line BLT thought the p-channel transistor 27 in an ON-state, as shown in FIG. 2. The bit line source signal LSYN of the level ⅓ Vcc is supplied to the bit line BLB through the n-channel transistor 24 in an ON-state, while the bit line source signal LSYP of the level ⅓ Vcc is supplied to the bit line BLB through the p-channel transistor 30 in an ON-state. Consequently, as shown in FIG. 3, the voltage applied to the bit line BLT is directly changed from the applied voltage (Vss) responsive to the first rewrite operation to the applied voltage (Vcc) responsive to the second rewrite operation. The voltage applied to the bit line BLB is directly changed from the applied voltage (⅔ Vcc) responsive to the first rewrite operation to the applied voltage (⅓ Vcc) responsive to the second rewrite operation.

In the period T5, the potential of the sense amplifier activation signal SA is stepped down from the level Vcc to the level Vss. Thus, as shown in FIG. 2, the potential of the signal VSP (see FIG. 3) supplied to the sources of the p-channel transistors 31a and 32a of the amplification portion 18 is stepped down from the level Vcc to the level Vss. The signal VSN (see FIG. 3) supplied to the sources of the n-channel transistors 31b and 32b of the amplification portion 18 is stepped up from the level Vss to the level Vcc. Therefore, all transistors included in the amplification portion 18 are turned off, thereby bringing the amplification portion 18 into an inactivated state. Thus, the amplification portion 18 terminates the amplification operation of the reading voltage.

In the aforementioned period T5, a voltage −Vcc is applied to the ferroelectric capacitor 15a (see FIG. 2) included in the selected memory cell 16 connected to the bit line BLT as shown in FIG. 4. The voltage −⅓ Vcc is applied to the ferroelectric capacitor 15b (see FIG. 2) included in the selected memory cell 16 connected to the bit line BLB. The voltage −⅓ Vcc is applied to the ferroelectric capacitors 15a included in nonselected memory cells 16 connected to the bit line BLT. The voltage +⅓ Vcc is applied to the ferroelectric capacitors 15b included in the nonselected memory cells 16 connected to the bit line BLB.

(Period T6)

In this period T6, the voltage applied to the nonselected word lines WL is changed from the level ⅔ Vcc to the level Vss as shown in FIG. 3. The respective potentials of the bit line source signals HSYP, LSYP, HSYN and LSYN are returned to initial states. In other words, the potential of the bit line source signal HSYP is held at the level Vcc, while the potential of the bit line source signal LSYP is stepped up from the level ⅓ Vcc to the level Vcc. The potential of the bit line source signal HSYN is stepped down from the level Vcc to the level Vss, while the potential of the bit line source signal LSYN is stepped down from the level ⅓ Vcc to the level Vss. The latch signal BLTG is stepped up from the level Vss to the level Vcc, thereby turning on the n-channel transistors 25 and 26 (see FIG. 2) of the bit line control portion 17. In this state, a recharger circuit (not shown) precharges the potentials of the bit lines BLT and BLB (nodes SNT and SNB of the amplification portion 18) to the level Vss.

In the aforementioned period T6, the voltages applied to all ferroelectric capacitors 15a and 15b (see FIG. 2) included in the selected memory cell 16 and the nonselected memory cells 16 are changed to 0 V as shown in FIG. 4. Thus, data "H" destroyed by the aforementioned read operation is written in the ferroelectric capacitor 15a in the selected memory cell 16. On the other hand, no data is not written in the ferroelectric capacitor 15b included in the selected memory cell 16.

According to the first embodiment, the voltages applied to the bit line BL and the nonselected word lines WL are controlled throughout the periods T1 to T6 (one cycle) during which the read and rewrite operations are performed, in the aforementioned manner, whereby the voltage −⅓ Vcc (first voltage pulse) is applied to the ferroelectric capacitors 15a holding data "H" in the nonselected memory cells 16 twice and the voltage +⅓ Vcc (second voltage pulse) is applied to the same once during one cycle. The voltages −⅓ Vcc (first voltage pulse) and +⅓ Vcc (second voltage pulse) are applied to the ferroelectric capacitors 15b holding data "L" in the nonselected memory cells 16 by the same frequencies (once) respectively.

According to the first embodiment, as hereinabove described, when making a transition of the respective operations (read operation, first rewrite operation and second rewrite operation) performed for reading data in the selected memory cell 16, the voltages applied to the bit lines BL and the word lines WL are directly changed from the applied voltages responsive to the operation before making a transition to the applied voltages responsive to the operation after making a transition, whereby a period of time necessary for one cycle (period for performing one read operation, one first rewrite operation and one second rewrite operation) can be shortened as compared with a case where a period for applying a voltage different from the voltages responsive to the respective operations before and after making a transition is provided between the period for applying the voltage responsive to the operation before making the transition and the period for applying the voltage responsive to the operation after making the transition. Consequently, the ferroelectric memory can be operated at a high speed.

According to the first embodiment, as hereinabove described, the voltages responsive to the rewrite operation (first rewrite operation and second rewrite operation) are applied to the bit lines BL and the word lines WL in parallel with the period for amplifying the reading voltage outputted to the bit lines BL, whereby the operation for outputting the signal based on the amplified reading voltage and the first and second rewrite operations can be performed in parallel with each other. Thus, the operating speed of the ferroelectric memory can be increased. The sense amplifier 2 for holding the reading voltage outputted from the selected memory cell 16 to the bit lines BL is provided, whereby the reading voltage outputted to the bit lines BL is held in the sense amplifier 2 and hence the reading voltage can be inhibited from becoming an intended value, even if the voltage responsive to the rewrite operation (first rewrite operation and second rewrite operation) is applied to the bit lines BL in parallel with the period for amplifying the reading voltage.

According to the first embodiment, as hereinabove described, the voltage applied to the bit lines BL is switched based on the amplified reading voltage after amplifying the reading voltage outputted to the bit lines BL when applying the voltage responsive to the rewrite operation to the bit lines BL, whereby the voltage responsive to the reading voltage can be easily applied to the bit lines BL in the rewrite operation even if the rewrite operation is performed in parallel with the read operation.

According to the first embodiment, as hereinabove described, the voltage applied to the bit lines BLT connected to the nonselected memory cells 16 is switched such that the voltage of reversed polarity to the voltage applied in the second rewrite operation is applied to the nonselected memory cells 16 (ferroelectric capacitors 15a holding the data "H") in the first rewrite operation, whereby the polarization state of the nonselected memory cells 16 (ferroelectric capacitors 15a holding data "H") is alternately deteriorated and improved. Thus, the nonselected memory cells 16 can be prevented from deterioration of the polarization state. The voltage responsive to the first rewrite operation applied to the bit line BLT is switched after amplifying the reading voltage outputted to the bit line BLT, whereby the type of the reading voltage outputted to the bit line BLT can be easily determined.

According to the first embodiment, as hereinabove described, the voltage −⅓ Vcc (first voltage pulse) is applied to the ferroelectric capacitors 15a holding data "H" in the nonselected memory cells 16 twice and the voltage +⅓ Vcc (second voltage pulse) is applied to the same once throughout one cycle (periods T1 to T6), whereby the ferroelectric capacitors 15a holding data "H" in the nonselected memory cells 16 can be easily prevented from deterioration of a polarization state. The voltage pulse −⅓ Vcc (first voltage pulse) voltage and the voltage pulse +⅓ Vcc (second voltage pulse) are applied to the ferroelectric capacitors 15b holding data "L" in the nonselected memory cells 16 by the same frequencies (once) respectively, whereby the ferroelectric capacitors 15b holding data "L" in the nonselected memory cells 16 can be prevented from deterioration of a polarization state.

Figure 5:
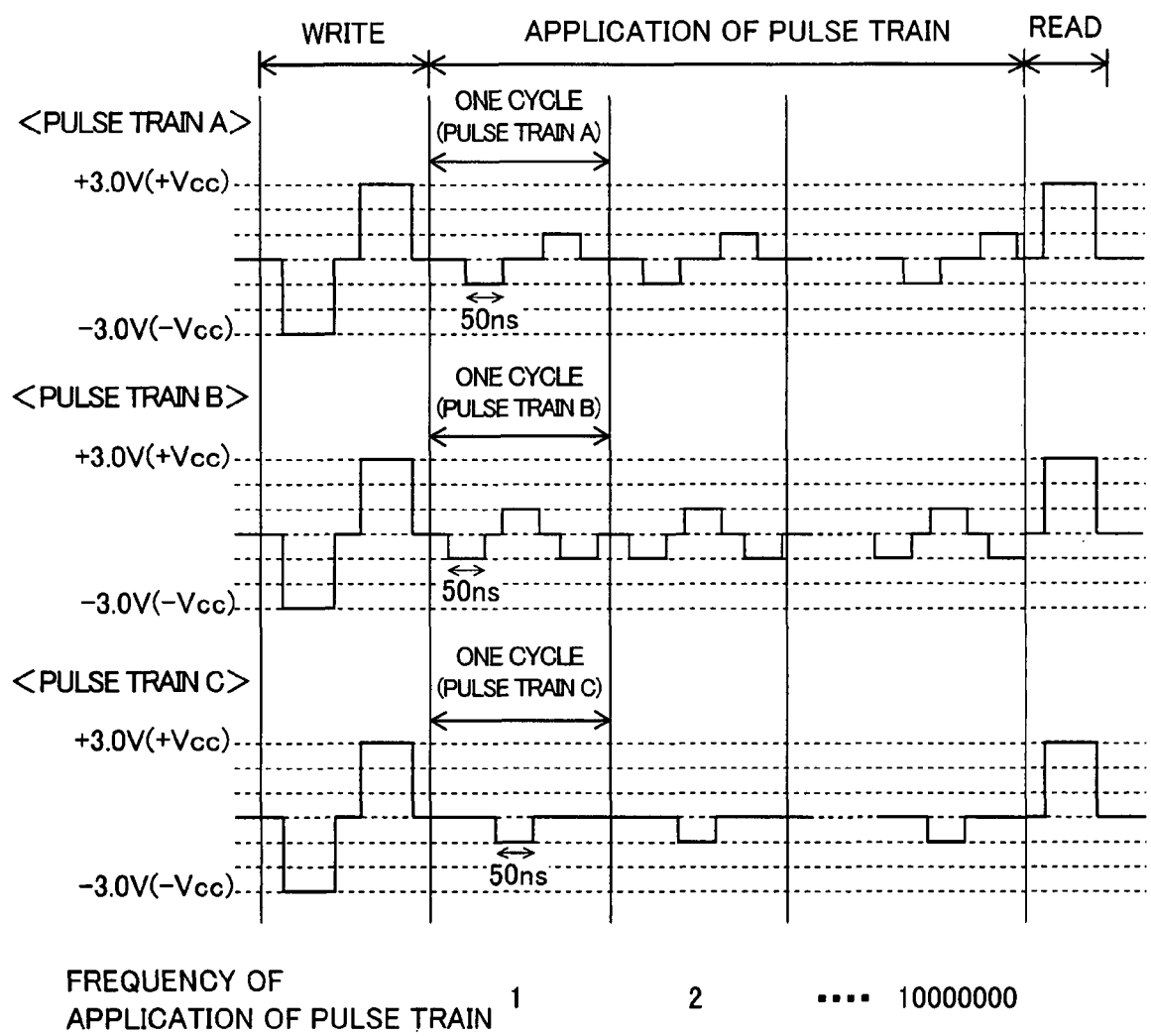
FIG. 5 is a voltage waveform diagram for illustrating an experiment conducted for confirming effects of the first embodiment.
Figure 6:
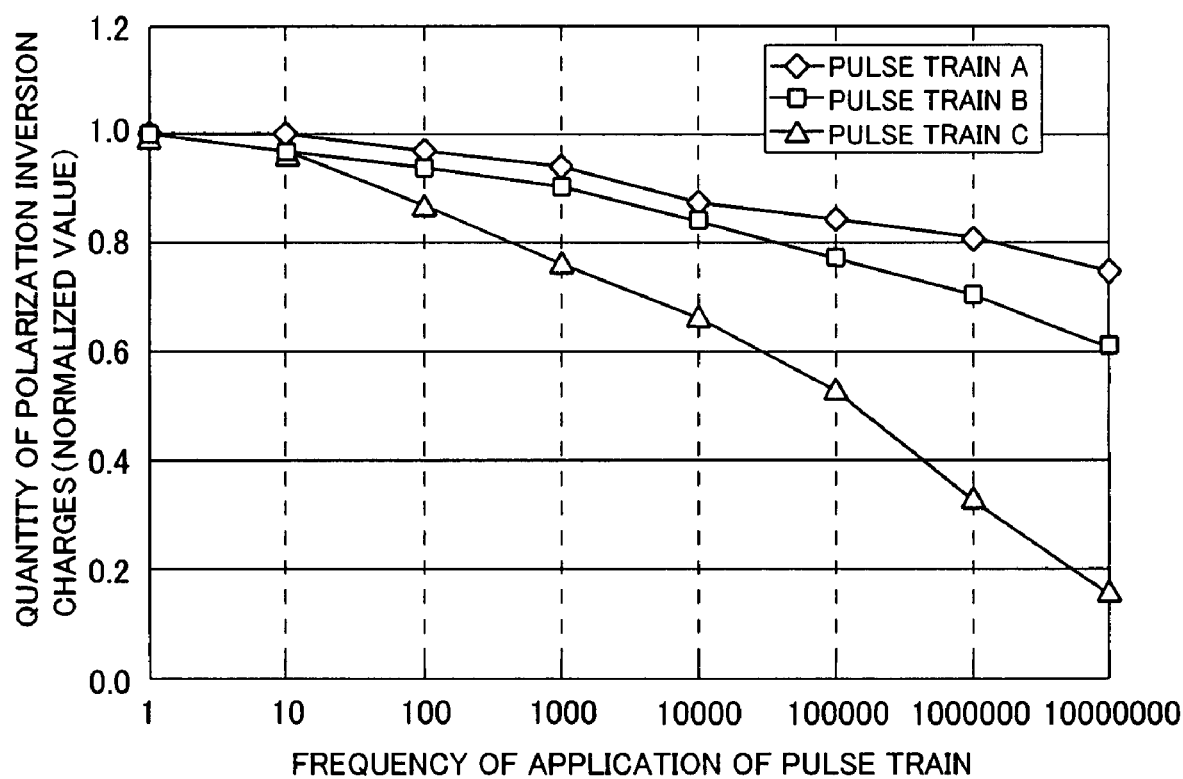
FIG. 6 is a graph showing measurement results (changes in quantities of polarization inversion charges) of the experiment conducted for confirming effects of the first embodiment.

With reference to FIGS. 5 and 6, an experiment conducted for confirming effects on a polarization state of nonselected memory cells according to the aforementioned first embodiment will be now described.

In this confirmatory experiment, a ferroelectric memory having a structure similar to that of the first embodiment shown in FIGS. 1 and 2 is prepared. As shown in FIG. 5, data was written by applying a voltage pulse −3 V (−Vcc) and a voltage pulse +3 V (Vcc) to a prescribed memory cell once. Thereafter quantities of polarization inversion charges in applying a pulse train A, a pulse train B and a pulse train C to the prescribed memory cell respectively were measured.

The pulse train A includes one first voltage pulse of −1 V (−⅓ Vcc) and one second voltage pulse of +1 V (+⅓ Vcc). In other words, in the pulse train A, difference between frequencies of application of the first voltage pulse and the second voltage pulse is 0. The pulse train B includes two first voltage pulse (−1 V) and one second voltage pulse (+1 V). In other words, in the pulse train B, difference between frequencies of application of the first voltage pulse and the second voltage pulse is 1. The pulse train C includes one first voltage pulse (−1 V). The aforementioned pulse trains B and C are pulse trains used in a case where the ferroelectric capacitor included in the memory cell holds data "L", the pulse train B including one first voltage pulse (−1 V) and two second voltage pulse (+1 V) and the pulse train C including one second voltage pulse (+1 V) are used in a case where the ferroelectric capacitor included in the memory cell holds data "H".

It is assumed that the frequencies of application of the pulse trains A to C to the prescribed memory cell once were set to 10,000,000 times ($10^7$ times). In this confirmatory experiment, it is assumed that a period for applying the pulse trains A to C to the memory cell once was one cycle. It is assumed that the pulse width of the first voltage pulse and the second voltage pulse was 50 ns. The quantity of polarization inversion charges measured in the aforementioned manner was normalized assuming that a quantities of polarization inversion charges was "1" when a frequency of application is one time.

It has been proved that quantities of polarization inversion charges of respective memory cells to which the pulse trains A to C are applied 10,000,000 times respectively are changed as shown in FIG. 6. More specifically, it has been proved that reduction in the quantities of polarization inversion charges is suppressed in the memory cell to which the pulse train A including one first voltage pulse (−1 V) and one second voltage pulse (+1 V) was applied, as compared with the memory cell to which other pulse trains B and C were applied. Thus, in a case where the first voltage pulse (−1 V) and the second voltage pulse (+1 V) of different polarities each other are applied to the memory cell by the same frequencies respectively, the polarization state of the memory cell is deteriorated and improved by the same frequencies respectively, whereby the memory cell can be conceivably prevented from deterioration of the polarization.

It has been proved that reduction rate of the quantities of polarization inversion charges is slightly increased in the memory cell to which the pulse train B including two first voltage pulse (−1 V) and one second voltage pulse (+1 V) was applied, as compared with the memory cell to which the pulse train A including one first voltage pulse (−1 V) and one second voltage pulse (+1 V) was applied. On the other hand, it has been proved that reduction in the quantities of polarization inversion charges is suppressed as compared with the memory cell to which the pulse train C including one first voltage pulse (−1 V) was applied. Thus, when the first voltage pulse (−1 V) and the second voltage pulse (+1 V) of different polarities each other are applied to the memory cell one time or more, and difference between the frequencies of application of the first voltage pulse (−1 V) and the second voltage pulse (+1 V) is one time or less in one cycle, even if the first voltage pulse (−1 V) and the second voltage pulse (+1 V) of difference polarities each other are not applied to the memory cell by the same frequencies respectively, the memory cell can be conceivably prevented from deterioration of the polarization state.

From this result, according to the aforementioned first embodiment, the voltage −⅓ Vcc (first voltage pulse) is applied to the ferroelectric capacitors 15a in the nonselected memory cells 16 connected to the bit line BLT twice and the voltage +⅓ Vcc (second voltage pulse) is applied to the same once in one cycle, and hence it can be said that the nonselected memory cells 16 (ferroelectric capacitors 15a) are prevented from deterioration of the polarization state. The voltage −⅓ Vcc (first voltage pulse) and the voltage +⅓ Vcc (second voltage pulse) are applied to the ferroelectric capacitors 15b in the nonselected memory cells 16 connected to the bit line BLB by the same frequencies (once) respectively, whereby it can be said that the nonselected memory cells are further prevented from deterioration of the polarization state.

Second Embodiment

Figure 7:
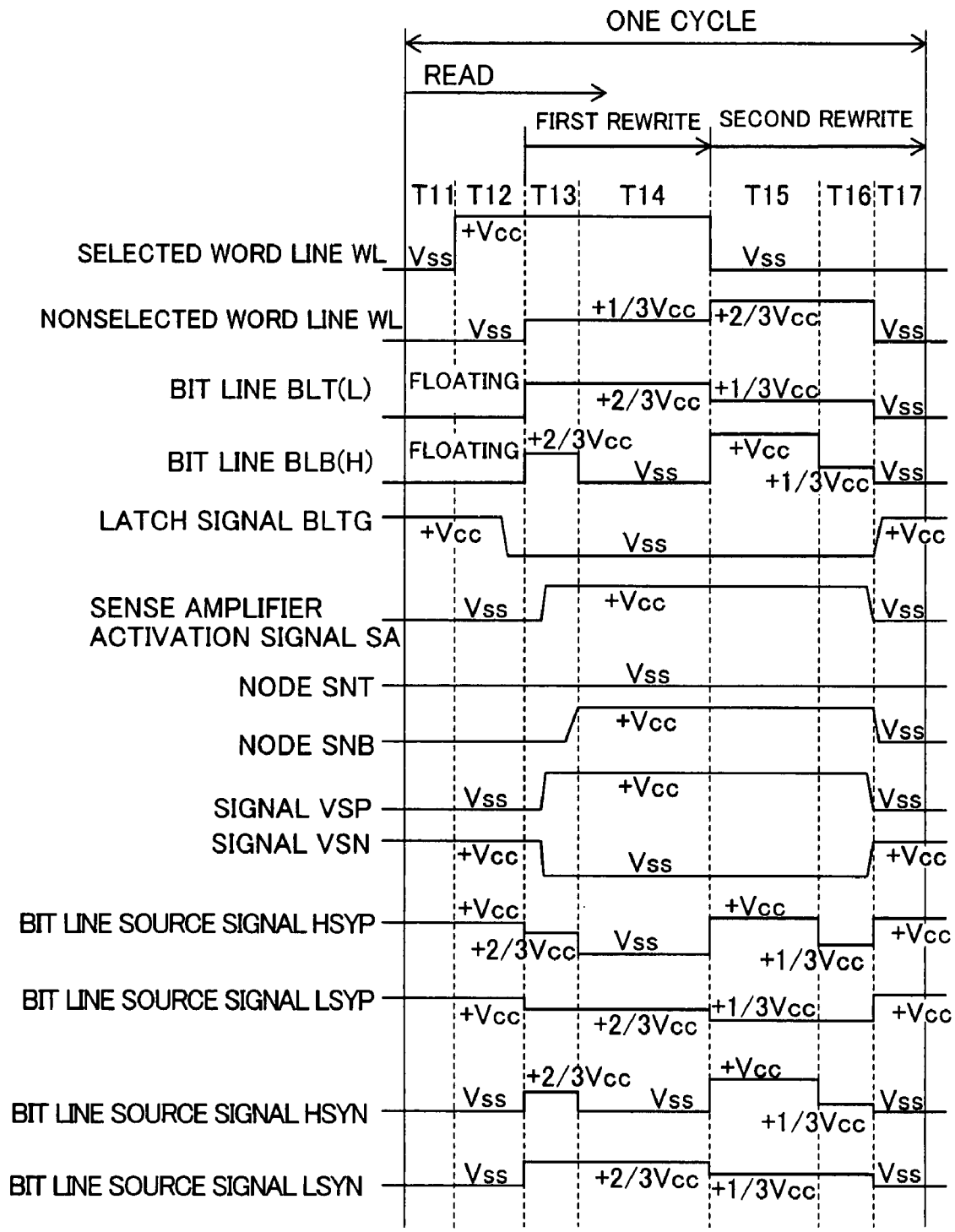
FIGS. 7 and 8 are voltage waveform diagrams for illustrating operations of the ferroelectric memory according to a second embodiment of the present invention.
Figure 8:
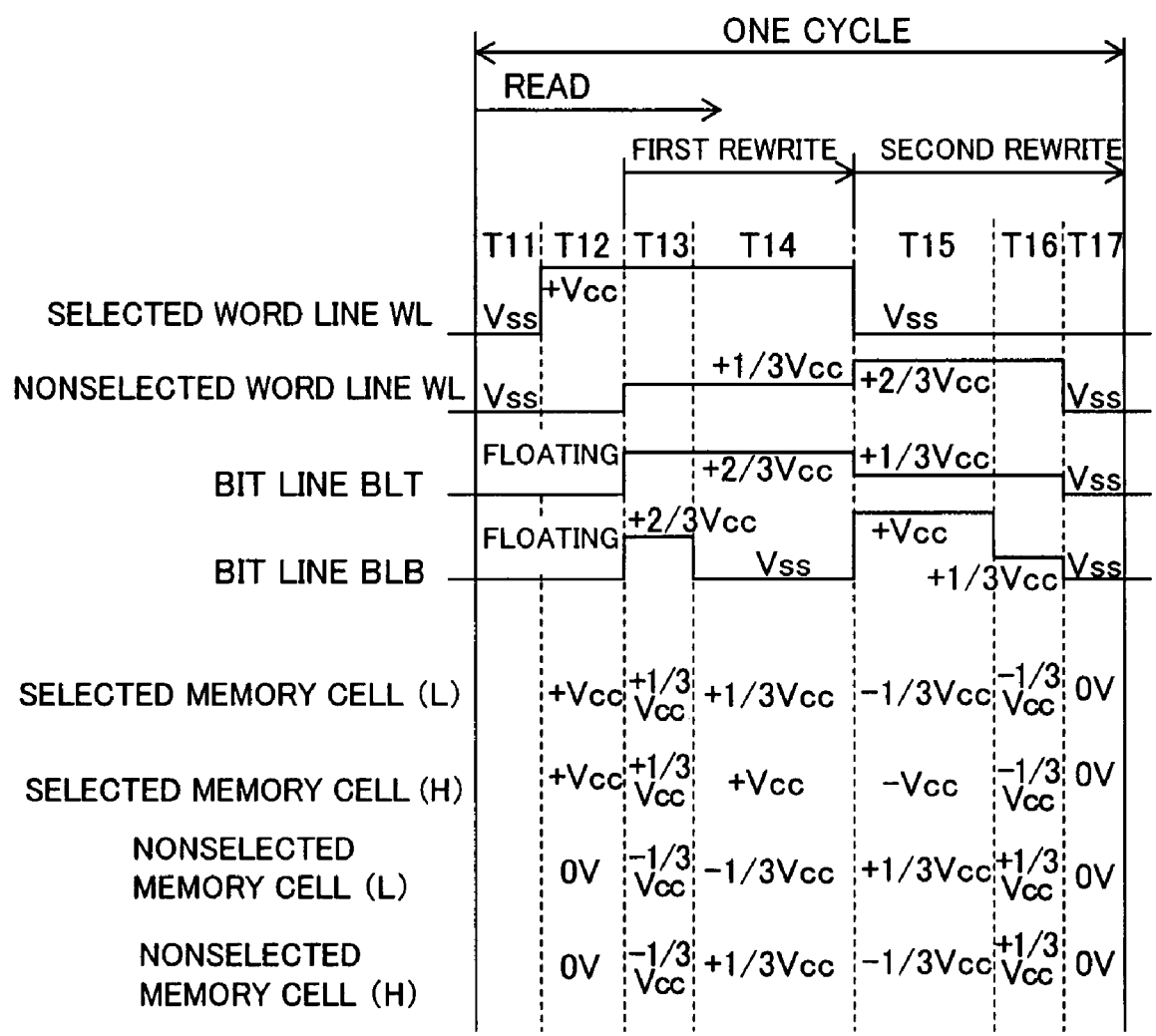

With reference to FIGS. 2, 7 and 8, according to a second embodiment, a voltage −⅓ Vcc (first voltage pulse) and a voltage +⅓ Vcc (second voltage pulse) are applied to the nonselected memory cells in one cycle in the structure of the ferroelectric memory of the aforementioned first embodiment. In the following description of operations, it is assumed that the selected memory cell 16 holds data "L". In other words, it is assumed that the ferroelectric capacitors 15a and 15b constituting the selected memory cell 16 hold data "L" and data "H" respectively.

The ferroelectric memory according to the second embodiment performs read and rewrite operations in the periods T11 to T17 (one cycle), as shown in FIG. 7. According to the second embodiment, the ferroelectric memory performs the read operation from the period T11 to the middle of the period T14. The ferroelectric memory performs a first rewrite operation in the periods T13 and T14, while performing a second rewrite operation in the periods T15 to T17. In other words, according to the second embodiment, the first rewrite operation is started in the period T13 during which the read operation is performed. Operations in the periods T11 to T17 will be hereinafter more specifically described.

(Period T11)

As shown in FIG. 7, the voltages applied to the selected word line WL and the nonselected word lines WL are held at the level VSS while the bit lines BLT and BLB are held in floating states in the period T11 (initial state), similarly to the period T1 (initial state) of the aforementioned first embodiment. Respective signals are held at the same potentials as those of the respective signals in the period T1 (initial state) of the aforementioned first embodiment.

(Period T12)

Operations performed in the period T12 shown in FIG. 7 are similar to those performed in the period T2 of the aforementioned first embodiment. In other words, in the period T12, the reading voltage generated in the bit line BLT is transmitted to the node SNT of the amplification portion 18 through the n-channel transistor 25 in an ON-state of the bit line control portion 17 as shown in FIG. 2. The reading voltage generated in the bit line BLB is transmitted to the node SNB of the amplification portion 18 through the n-channel transistor 26 in an ON-state of the bit line control portion 17. Thereafter the n-channel transistors 25 and 26 are turned off, whereby the reading voltage generated in the bit line BLT is held in the node SNT of the amplification portion 18, while the reading voltage generated in the bit line BLB is held in the node SNB of the amplification portion 18.

(Period T13)

Operations performed in the period T13 shown in FIG. 7 are similar to those performed in the period T3 of the aforementioned first embodiment. In other words, in the period T13, the bit line source signals HSYP and LSYP of the level ⅔ Vcc are supplied to the bit line BLT through the p-channel transistors 27 and 28 in ON-states as shown in FIG. 2. The bit line source signals HSYP and LSYP of the level ⅔ Vcc are supplied to the bit line BLB through the p-channel transistors 29 and 30 in ON-states. Consequently, as shown in FIG. 7, the voltages applied to the bit lines BLT and BLB are directly changed from the applied voltages (reading voltage) responsive to the read operation to the applied voltage (⅔ Vcc) responsive to the first rewrite operation.

In the period T13, the amplification portion 18 (see FIG. 2) is activated, whereby an amplification operation by the amplification portion 18 is started. According to the second embodiment, as shown in FIG. 2, the n-channel transistor 31b and the p-channel transistor 32a are turned on, thereby activating the amplification portion 18. Thus, according to the second embodiment, the reading voltage of the bit line BLT, held in the node SNT of the amplification portion 18, is stepped down to the level Vss, while the reading voltage of the bit line BLB, held in the node SNB of the amplification portion 18, is stepped up to the level Vcc, whereby the difference between the reading voltage of the bit line BLT and the reading voltage of the bit line BLB is amplified. This amplification operation in the amplification portion 18 continues until the period T16 (see FIG. 7) terminates. Thereafter, operations similar to those of the aforementioned first embodiment are performed, thereby outputting a signal based on the amplified reading voltage.

As shown in FIG. 2, the amplified reading voltage Vss of the bit line BLT is supplied from the amplification portion 18 (node SNT) to the gates of the n-channel transistors 21 and 24 and the p-channel transistors 28 and 29 of the bit line control portion 17. The amplified reading voltage Vcc of the bit line BLB is supplied from the amplification portion 18 (node SNB) to the gates of the n-channel transistors 22 and 23 and the p-channel transistors 27 and 30 of the bit line control portion 17. Thus, the n-channel transistors 21 and 24 are turned off, while the n-channel transistors 22 and 23 are turned on. The p-channel transistors 27 and 30 are turned off, while the p-channel transistors 28 and 29 are turned on.

In the aforementioned period T13, the voltage +⅓ Vcc is applied to the ferroelectric capacitor 15*a* (see FIG. 2) included in the selected memory cell 16 connected to the bit line BLT as shown in FIG. 8. The voltage +⅓ Vcc is applied also to the ferroelectric capacitor 15*b* (see FIG. 2) included in the selected memory cell 16 connected to the bit line BLB. The voltage −⅓ Vcc is applied to the ferroelectric capacitors 15*a* included in the nonselected memory cells 16 connected to the bit line BLT. The voltage −⅓ Vcc is applied also to the ferroelectric capacitors 15*b* included in the nonselected memory cells 16 connected to the bit line BLB.

(Period T14)

In this period T14, the potentials of the bit line source signals HSYP and HSYN are stepped down from the level ⅔ Vcc to the level Vss, while the potentials of the bit line source signals LSYP and LSYN are held at the level ⅔ Vcc, as shown in FIG. 7.

In this case, in the bit line control portion 17, the bit line source signal LSYN of the level ⅔ Vcc is supplied to the bit line BLT through the n-channel transistor 22 in an ON-state, while the bit line source signal HSYN of the level Vss is supplied to the bit line BLB through the n-channel transistor 23 in an ON-state, as shown in FIG. 2. The bit line source signal LSYP of the level ⅔ Vcc is also supplied to the bit line BLT through the p-channel transistor 28 in an ON-state, while the bit line source signal HSYP of the level Vss is also supplied to the bit line BLB through the p-channel transistor 29 in an ON-state. Consequently, as shown in FIG. 7, the voltage applied to the bit line BLT is held at the level ⅔ Vcc, while the voltage applied to the bit line BLB is changed from the level ⅔ Vcc to the level Vss.

In the aforementioned period T14, the voltage +⅓ Vcc is applied to the ferroelectric capacitor 15*a* (see FIG. 2) included in the selected memory cell 16 connected to the bit line BLT as shown in FIG. 8. The voltage +Vcc is applied to the ferroelectric capacitor 15*b* (see FIG. 2) included in the selected memory cell 16 connected to the bit line BLB. The voltage −⅓ Vcc is applied to the ferroelectric capacitors 15*a* included in the nonselected memory cells 16 connected to the bit line BLT. The voltage +⅓ Vcc is applied to the ferroelectric capacitors 15*b* included in the nonselected memory cells 16 connected to the bit line BLB.

(Period T15)

In this period T15, the voltage applied to the selected word line WL is directly changed from the applied voltage (Vcc) responsive to the first rewrite operation to the applied voltage (Vss) responsive to the second rewrite operation, as shown in FIG. 7. The voltage applied to the nonselected word lines WL is directly changed from the applied voltage (⅓ Vcc) responsive to the first rewrite operation to the applied voltage (⅔ Vcc) responsive to the second rewrite operation. The potentials of the bit line source signals HSYP and HSYN are stepped up from the level Vss to the level Vcc, while the potentials of the bit line source signals LSYP and LSYN are stepped down from the level ⅔ Vcc to the level ⅓ Vcc.

In this case, in the bit line control portion 17, the bit line source signal LSYN of the level ⅓ Vcc is supplied to the bit line BLT through the n-channel transistor 22 in an ON-state, while the bit line source signal LSYP of the level ⅓ Vcc is supplied to the bit line BLT thought the p-channel transistor 28 in an ON-state, as shown in FIG. 2. The bit line source signal HSYN of the level Vcc is supplied to the bit line BLB through the n-channel transistor 23 in an ON-state, while the bit line source signal HSYP of the level Vcc is supplied to the bit line BLB through the p-channel transistor 29 in an ON-state. Consequently, as shown in FIG. 7, the voltage applied to the bit line BLT is directly changed from the applied voltage (⅔ Vcc) responsive to the first rewrite operation to the applied voltage (⅓ Vcc) responsive to the second rewrite operation. The voltage applied to the bit line BLB is directly changed from the applied voltage (Vss) responsive to the first rewrite operation to the applied voltage (Vcc) responsive to the second rewrite operation.

In the aforementioned period T15, a voltage −⅓ Vcc is applied to the ferroelectric capacitor 15*a* (see FIG. 2) included in the selected memory cell 16 connected to the bit line BLT as shown in FIG. 8. The voltage −Vcc is applied to the ferroelectric capacitor 15*b* (see FIG. 2) included in the selected memory cell 16 connected to the bit line BLB. The voltage +⅓ Vcc is applied to the ferroelectric capacitors 15*a* included in the nonselected memory cells 16 connected to the bit line BLT. The voltage −⅓ Vcc is applied to the ferroelectric capacitors 15*b* included in the nonselected memory cells 16 connected to the bit line BLB.

(Period T16)

In this period T16, the potential of the bit line source signal HSYP is stepped down from the level Vcc to the level ⅓ Vcc, while the potential of the bit line source signal LSYP is held at ⅓ Vcc, as shown in FIG. 7. The potential of the bit line source signal HSYN is stepped down from the level Vcc to the level ⅓ Vcc, while the potential of the bit line source signal LSYN is held at ⅓ Vcc.

In this case, in the bit line control portion 17, the bit line source signal LSYN of the level ⅓ Vcc is supplied to the bit line BLT through the n-channel transistor 22 in an ON-state, while the bit line source signal LSYP of the level ⅓ Vcc is supplied to the bit line BLT through the p-channel transistor 28 in an ON-state, as shown in FIG. 2. The bit line source signal HSYN of the level ⅓ Vcc is supplied to the bit line BLB through the n-channel transistor 23 in an ON-state, while the bit line source signal HSYP of the level ⅓ Vcc is supplied to the bit line BLB through the p-channel transistor 29 in an ON-state. Consequently, as shown in FIG. 7, the voltage applied to the bit line BLT is held at the level ⅓ Vcc, while the voltage applied to the bit line BLB is changed from the level Vcc to the level ⅓ Vcc.

In the period T16, the sense amplifier activation signal SA is stepped down from the level Vcc to the level Vss, thereby bringing the amplification portion 18 (see FIG. 2) into an inactivated state. Thus, the amplification portion 18 terminates the amplification operation of the reading voltage.

In the aforementioned period T16, the voltage −⅓ Vcc is applied to the ferroelectric capacitor 15a (see FIG. 2) included in the selected memory cell 16 connected to the bit line BLT as shown in FIG. 8. The voltage −⅓ Vcc is applied also to the ferroelectric capacitor 15b (see FIG. 2) included in the selected memory cell 16 connected to the bit line BLB. The voltage +⅓ Vcc is applied to the ferroelectric capacitors 15a included in the nonselected memory cells 16 connected to the bit line BLT. The voltage +⅓ Vcc is applied also to the ferroelectric capacitors 15b included in the nonselected memory cells 16 connected to the bit line BLB.

(Period T17)

In this period T17, the voltage applied to the nonselected word lines WL is changed from the level ⅔ Vcc to the level Vss as shown in FIG. 7. The respective potentials of the bit line source signals HSYP, LSYP, HSYN and LSYN are returned to initial states. In other words, the potentials of the bit line source signals HSYP and LSYP are stepped up from the level ⅓ Vcc to the level Vcc. The potentials of the bit line source signals HSYN and LSYN are stepped down from the level ⅓ Vcc to the level Vss. The latch signal BLTG is stepped up from the level Vss to the level Vcc, thereby turning on the n-channel transistors 25 and 26 (see FIG. 2) of the bit line control portion 17. In this state, a precharge circuit (not shown) precharges the potentials of the bit lines BLT and BLB (nodes SNT and SNB of the amplification portion 18) to the level Vss.

In the aforementioned period T17, the voltages applied to all ferroelectric capacitors 15a and 15b (see FIG. 2) included in the selected memory cell 16 and the nonselected memory cells 16 are changed to 0 V as shown in FIG. 8.

According to the second embodiment, the voltages applied to the bit line BL and the nonselected word lines WL are controlled throughout the periods T11 to T17 (one cycle) during which the read and rewrite operations are performed, in the aforementioned manner, whereby the voltage −⅓ Vcc (first voltage pulse) and the voltage +⅓ Vcc (second voltage pulse) are applied to the ferroelectric capacitors 15b holding data "H" in the nonselected memory cells 16 by the same frequencies (twice) respectively in one cycle. The voltages −⅓ Vcc (first voltage pulse) and +⅓ Vcc (second voltage pulse) are applied also to the ferroelectric capacitors 15a holding data "L" in the nonselected memory cells 16 by the same frequencies (once) respectively in one cycle.

According to the second embodiment, as hereinabove described, the voltage pulses −⅓ Vcc (first voltage pulse) and +⅓ Vcc (second voltage pulse) are applied to the ferroelectric capacitors 15b holding data "H" in the nonselected memory cells 16 by the same frequencies (twice) respectively throughout one cycle (periods T11 to T17), whereby the polarization state of the ferroelectric capacitors 15b holding data "H" in the nonselected memory cells 16 is deteriorated and improved by the same frequencies (twice) respectively. Thus, the polarization state of the ferroelectric capacitors 15b holding data "H" in the nonselected memory cells 16 can be prevented from deterioration of the polarization state.

The remaining effects of the ferroelectric memory according to the second embodiment are similar to those of the ferroelectric memory according to the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to a ferroelectric memory in the aforementioned first and second embodiments, the present invention is not restricted to this but is also applicable to a nonvolatile memory other than the ferroelectric memory.

While the ferroelectric memory is so formed that the rewrite operation is started in the period during which the read operation is performed in the aforementioned first and second embodiments, the present invention is not restricted to this but the voltages applied to the bit lines and the word lines may be directly changed from the applied voltages responsive to the read operation to the applied voltages responsive to the rewrite operation after the read operation terminates.

While the first voltage pulse (−⅓ Vcc) is applied to the ferroelectric capacitors holding data "H" in the nonselected memory cells twice and the second voltage pulse (+⅓ Vcc) is applied to the same once in one cycle in the aforementioned first embodiment, the present invention is not restricted to this but a frequency of the application in one cycle of the first voltage pulse may be three times or more, or a frequency of the application in one cycle of the second voltage pulse may be twice or more. In this case, difference between the frequency of the application of the first voltage pulse and the frequency of the application in one cycle of the second voltage pulse may be twice or more. Alternatively, the frequency of the application in one cycle of the first voltage pulse may be less than the frequency of the application in one cycle of the second voltage pulse.

What is claimed is:

1. A memory, comprising:
bit lines and word lines arranged to intersect with each other at intersectional positions; and
memory cells respectively arranged on the intersectional positions between the bit lines and the word lines, wherein:
the memory is configured to perform a read operation, a first rewrite operation, and a second rewrite operation if data of the memory cells is read;
the memory is further configured to start the read operation, the first rewrite operation, and the second rewrite operation by respectively changing voltages applied to the bit lines and the word lines to a first voltage in response to the read operation, to a second voltage in response to the first rewrite operation, and to a third voltage in response to the second rewrite operation the memory is further configured to directly change the voltages applied to the bit lines and the word lines from the first voltage, in response to the read operation, to the second voltage, in response to the first rewrite operation; and the memory is further configured to directly change the voltages applied to the bit lines and the word lines from the second voltage, in response to the first rewrite operation, to the third voltage, in response to the second rewrite operation.

2. The memory of claim 1, further comprising holding portions configured to hold a reading voltage outputted from the memory cells to the bit lines, wherein:
the memory is further configured to output the reading voltage from the memory cells to the bit lines by changing the voltages applied to the bit lines and the word lines to the first voltage in response to the read operation; and
the memory is further configured to apply the second voltage in response to the first rewrite operation and the third voltage in response to the second rewrite operation to the bit lines and the word lines in parallel with a period to amplify the reading voltage.

3. The memory of claim 2, wherein the memory is further configured to switch the voltages applied to the bit lines based on the amplified reading voltage, after the reading voltage is amplified, if the second or third voltages are applied to the bit lines.

4. The memory of claim 1, wherein the memory is further configured to apply a first voltage pulse providing a first electrical field in a first direction and a second voltage pulse providing a second electrical field in a second direction opposite, to the first direction, to at least one nonselected memory cell throughout the read operation, the first rewrite operation, and the second rewrite operation.

5. The memory of claim 4, wherein frequencies of application in one cycle of the first voltage pulse and the second voltage pulse are at least once, and wherein a difference between frequencies of application in one cycle of the first voltage pulse and the second voltage pulse is at most once.

6. The memory of claim 5, wherein the frequencies of application in one cycle of the first voltage pulse and the second voltage pulse are once and twice respectively.

7. The memory of claim 5, wherein the frequencies of application in one cycle of the first voltage pulse and the second voltage pulse are the same.

8. The memory of claim 1, wherein the memory is further configured to amplify a reading voltage outputted to the bit lines after the read operation to the first rewrite operation.

9. The memory of claim 8, wherein the memory is further configured to control the bit lines at a potential at which no data is written in the memory cells during a period in which the memory is configured to amplify the reading voltage outputted to the bit lines.

10. The memory of claim 8, wherein for the first rewrite operation, the memory is configured to rewrite second data different from first data in a first memory cell where the first data is written and to not rewrite data in a second memory cell where the second data is written after a period during which the reading voltage outputted to the bit lines is amplified.

11. The memory of claim 1, wherein for the second rewrite operation, the memory is configured to rewrite first data in a first memory cell where the first data is written and to not rewrite data in a second memory cell where second data is written.

12. The memory of claim 11, wherein the memory is further configured to directly change the voltages applied to the bit lines and the word lines to the first voltage in response to the read operation, after the first data is rewritten in the second rewrite operation in the first memory cell, or if no data is rewritten in the second rewrite operation in the second memory cell.

13. The memory of claim 1, wherein for said second rewrite operation, the memory is configured to apply a first voltage pulse providing a first electrical field in a first direction and a second voltage pulse providing a second electrical field in a second direction, opposite to the first direction, to at least some nonselected memory cells.

14. The memory of claim 13, wherein the memory is further configured to apply both the first voltage pulse and the second voltage pulse twice in one cycle.

15. The memory of claim 2, further comprising bit line control portions configured to control potentials of respective bit lines provided between the memory cells and the holding portions.

16. The memory of claim 15, wherein each of the bit line control portions comprises a plurality of signal lines configured to supply a voltage to control the bit lines at the second voltage in response to the first rewrite operation or at the third voltage in response to the second rewrite operation.

17. The memory of claim 15, further comprising a plurality of transistors respectively configured to electrically isolate each of the bit line control portions and each of the holding portions from each other, wherein each respective transistor is coupled between each of the bit line control portions and each of the holding portions.

18. The memory of claim 1, wherein each of the memory cells comprises a ferroelectric capacitor.

19. The memory of claim 18, wherein each of the memory cells comprises a first ferroelectric capacitor configured to have first data written therein and a second ferroelectric capacitor configured to have second data, different from the first data, written therein.

20. A method for operating a memory having memory cells respectively arranged on intersectional positions between bit lines and word lines, the method comprising:
performing a read operation, a first rewrite operation, and a second rewrite operation if data of the memory cells of the memory is read, wherein said performing a read operation, a first rewrite operation, and a second rewrite operation is started by respectively changing voltages applied to the bit lines and the word lines to a first voltage in response to the read operation, to a second voltage in response to the first rewrite operation, and to a third voltage in response to the second rewrite operation directly changing the voltages applied to the bit lines and the word lines from the first voltage, in response to the read operation, to the second voltage, in response to the first rewrite operation; and directly changing the voltages applied to the bit lines and the word lines from the second voltage, in response to the first rewrite operation, to the third voltage, in response to the second rewrite operation.

21. The method of claim 20, further comprising holding a reading voltage outputted from the memory cells to the bit lines, wherein:
the reading voltage is outputted from the memory cells to the bit lines by changing the voltages applied to the bit lines and the word lines to the first voltage in response to the read operation; and
the second voltage in response to the first rewrite operation and the third voltage in response to the second rewrite operation are applied to the bit lines and the word lines in parallel with a period to amplify the reading voltage.

22. The method of claim 20, further comprising applying a first voltage pulse providing a first electrical field in a first direction and a second voltage pulse providing second electrical field in a second direction opposite to the first direction to at least one nonselected memory cell throughout the read operation, the first rewrite operation, and the second rewrite operation.

23. An apparatus, comprising:
a memory having memory cells respectively arranged on intersectional positions between bit lines and word lines; and
circuit means for performing a read operation, a first rewrite operation, and a second rewrite operation if data of the memory cells of the memory is read, wherein:
the circuit means starts the read operation, the first rewrite operation, and the second rewrite operation by respectively changing voltages applied to the bit lines and the word lines to a first voltage in response to the read operation, to a second voltage in response to the first rewrite operation, and to a third voltage in response to the second rewrite operation the circuit means directly changes the voltages applied to the bit lines and the word lines from the first voltage, in response to the read operation, to the second voltage, in response to the first rewrite operation; and the circuit means directly changes the voltages applied to the bit lines and the word lines from the second voltage, in response to the first rewrite operation, to the third voltage, in response to the second rewrite operation.

24. The apparatus of claim 23, wherein the memory cells each comprise a ferroelectric capacitor.

25. The apparatus of claim 23, wherein for the second rewrite operation, the circuit means rewrites first data in a first memory cell where the first data is written and does not rewrite data in a second memory cell where second data is written.

26. The memory of claim 1, wherein the voltages that are directly changed, from the second voltage, in response to the first rewrite operation to the third voltage, in response to the second rewrite operation, include a voltage applied to a non-selected word line.

27. The method of claim 20, wherein the voltages that are directly changed, from the second voltage, in response to the first rewrite operation, to the third voltage, in response to the second rewrite operation, include a voltage applied to a non-selected word line.

28. The method of claim 20, further comprising amplifying a reading voltage outputted to the bit lines after the read operation rewrite operation.

29. The method of claim 20, wherein said performing a second rewrite operation comprises rewriting first data in a first memory cell where the first data is written and not rewriting data in a second memory cell where second data is written.

30. The apparatus of claim 23, wherein the voltages that are directly changed, from the second voltage, in response to the first rewrite operation, to the third voltage, in response to the second rewrite operation, include a voltage applied to a non-selected word line.

31. The apparatus of claim 23, wherein said circuit means includes means for amplifying a reading voltage outputted to the bit lines after the read operation to the first rewrite operation.

32. The apparatus of claim 23, wherein for the second rewrite operation, the circuit means rewrites first data in a first memory cell where the first data is written and does not rewrite data in a second memory cell where second data is written.

* * * * *

UNITED STATES PATENT AND TRADEMARK OFFICE
CERTIFICATE OF CORRECTION

PATENT NO. : 7,768,845 B2
APPLICATION NO. : 11/727466
DATED : August 3, 2010
INVENTOR(S) : Hideaki Miyamoto It is certified that error appears in the above-identified patent and that said Letters Patent is hereby corrected as shown below:

Column 20, line 3, "operation rewrite operation." should read --operation.--.
Column 20, lines 15-16, "operation to the first rewrite operation." should read --operation.--.

Signed and Sealed this

Seventh Day of December, 2010

David J. Kappos
*Director of the United States Patent and Trademark Office*